United States Patent
Messager

(10) Patent No.: US 7,173,798 B2
(45) Date of Patent: Feb. 6, 2007

(54) DCDC VOLTAGE CONVERTER OVERLOAD DETECTOR, AND CORRESPONDING COMPONENT AND DEVICE

(75) Inventor: Philippe M. Messager, Nantes (FR)

(73) Assignee: Atmel Nantes S.A., Nantes (FR)

( * ) Notice: Subject to any disclaimer, the term of this patent is extended or adjusted under 35 U.S.C. 154(b) by 329 days.

(21) Appl. No.: 10/299,993

(22) Filed: Nov. 19, 2002

(65) Prior Publication Data
US 2003/0094968 A1    May 22, 2003

(30) Foreign Application Priority Data
Nov. 19, 2001 (FR) .................................. 01 14963

(51) Int. Cl.
*H02H 9/08* (2006.01)
(52) U.S. Cl. ........................................ 361/18; 361/93.9
(58) Field of Classification Search ................. 361/18, 361/91.1, 91.2, 91.3, 93.7, 93.8, 93.9, 111, 361/31; 307/131; 323/315
See application file for complete search history.

(56) References Cited

U.S. PATENT DOCUMENTS

| | | | | |
|---|---|---|---|---|
| 4,061,962 A | * | 12/1977 | Stewart | ....................... 323/273 |
| 4,553,084 A | * | 11/1985 | Wrathall | ..................... 323/316 |
| 4,580,070 A | | 4/1986 | Westman | |
| 5,079,456 A | * | 1/1992 | Kotowski et al. | ........... 327/538 |
| 5,892,389 A | * | 4/1999 | Lai | ............................ 327/543 |
| 5,909,112 A | * | 6/1999 | Kiyota et al. | ............... 323/315 |
| 6,181,120 B1 | * | 1/2001 | Hawkes et al. | ............. 323/282 |
| 6,304,108 B1 | * | 10/2001 | Inn | ............................. 327/72 |
| 6,426,612 B1 | * | 7/2002 | Rozsypal | .................... 323/282 |
| 6,433,488 B1 | * | 8/2002 | Bu | ......................... 315/169.3 |
| 6,580,258 B2 | * | 6/2003 | Wilcox et al. | ............. 323/282 |
| 6,603,358 B2 | * | 8/2003 | Shearon et al. | ............ 330/288 |
| 6,768,623 B1 | * | 7/2004 | Shen | ........................ 361/93.9 |

FOREIGN PATENT DOCUMENTS

| | | |
|---|---|---|
| FR | 2798538 | 3/2001 |
| JP | 03140881 | 6/1991 |

* cited by examiner

*Primary Examiner*—Brian Sircus
*Assistant Examiner*—Danny Nguyen
(74) *Attorney, Agent, or Firm*—Kinney & Lange, PA

(57) ABSTRACT

The invention concerns a detector of overloads for DCDC converters, the said converter supplying a load current with an output voltage (Vout) that may be different from a supply voltage (Vbat), by means of an inductance (L) and a first transistor (TP0), made conductive or blocked by regulation devices depending on the quantity of current demanded by the said load, the said detector having a means of capturing an image of the said load current at a predetermined smaller scale, and also a means of analysis that takes into account the said load current image to provide overload information when the said quantity of current is higher than a predetermined current threshold.

10 Claims, 7 Drawing Sheets

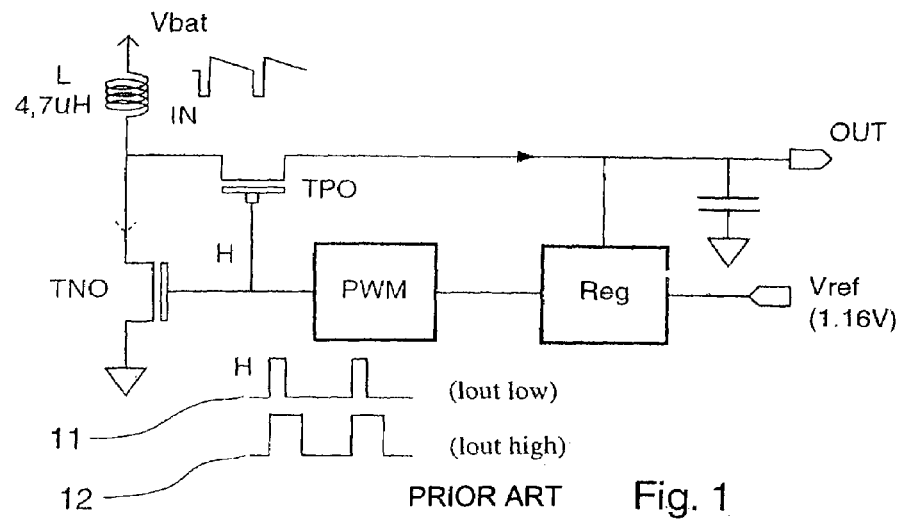
Fig. 1 PRIOR ART
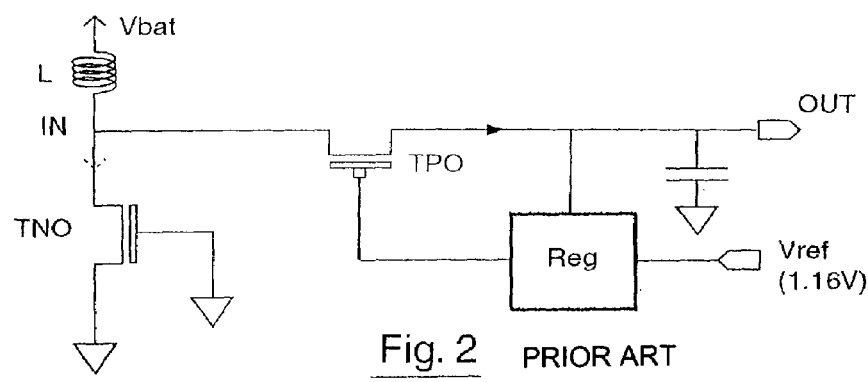
Fig. 2 PRIOR ART
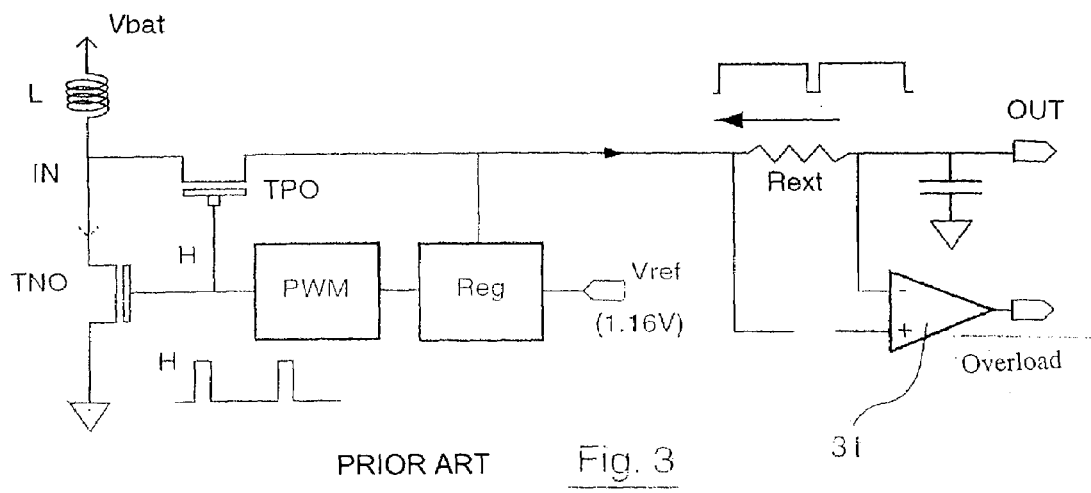
PRIOR ART  Fig. 3

DCDC VOLTAGE CONVERTER OVERLOAD DETECTOR, AND CORRESPONDING COMPONENT AND DEVICE

BACKGROUND OF THE INVENTION

The field of the invention is that of the power supply to electronical circuits, and in particular DCDC circuits (DC voltage converters), designed to supply a load current with an output voltage that is different from the input voltage. More precisely, the invention concerns the detection of possible overloads, in order to prevent the powered circuit from being damaged.

The invention has applications in many different fields, wherever a voltage needs to be modified and a supply current checked. One particular example of an application is that of the power supply to a chip card (SIM card, credit card, etc.) co-operating with a radio telephone, supplying a variable voltage from its battery.

There are several types of DCDC converters known. In particular, there are switched capacity converters, that provide unsatisfactory performances and inductive converters, which are more especially concerned by the invention.

The principle of an inductive converter is based on the fact that an inductance opposes the current variations, by increasing or decreasing the voltage at its terminal according to the rule: $dV/dt=L \cdot di/dt$.

The purpose of the converter is to increase (pump mode) or to decrease (regulation mode) an output voltage (Vout) with respect to a supply voltage (Vbat). For example, in the case of a chip card powered by a radio telephone, the output voltage should be 5 V permanently, whereas the battery can supply a voltage of between 2.7 and 5.5 V according to its charge.

FIG. 1 illustrates the operation of an inductive converter in pump mode, which is to say when Vbat>Vout. It therefore has an inductance L, of a value of 4.7 μH for example, one end of which is connected to the battery (Vbat) and the other end (IN) is connected on one side to an NMOS TN0 transistor and on the other side to a PMOS TP0 transistor.

The latter transistor provides the regulated output voltage Vout acting on the OUT output. Regulation devices send a command H, to the two transistors TN0 and TP0. The TN0 transistor is conductive when H=Vbat and blocked when H=0V, contrary to TP0 which is conductive when H=0 V and blocked when H=Vbat. They are therefore complementary.

This set-up permits a current to be imposed in the inductance L for a time t0, by means of the TN0 transistor, and then to cut off the TN0 transistor and to open the TP0 transistor for a time t1. The inductance L stores the energy during the period t0 and sends it back during t1, by trying to oppose the variations in the current.

Consequently, regardless of the voltage at the OUT terminal, the inductance L will increase the voltage at the IN terminal so that it can supply the current that the TN0 transistor has demanded during the time t0. This technique therefore allows a voltage Vout to be generated that is greater than the battery voltage Vbat, whilst also supplying current, and therefore acting as a power supply.

Depending on the current Iout demanded by the load, the cyclical relationship t0/(t0+t1) simply needs to be increased. FIG. 1 illustrates two examples of command H, where Iout is low (11) or high (12). The longer the time t0, the greater the current at the end of the t0 period will be, and the more energy will be stored by the inductance L. Consequently, the current supplied by during the period t1 is higher.

To obtain this H command, a REG regulator compares the output voltage Vout with a reference voltage Vref. (for example V ref.=1.6 V) and acts on a pulse width modulator (PWM) which varies the cyclical relationship t0/(t0+t1). If Vout is smaller than the desired voltage, the cyclical relationship is increased. Inversely, if Vout is higher than the desired voltage, then this cyclical relationship is reduced.

A converter of this type is efficient, between 75% and 98% (whereas the efficiency of a switched capacity converter is less than 50%).

Furthermore, it is easier to switch from the pump mode (if Vbat<Vout desired) as mentioned above, to the regulation mode (if Vbat>Vout desired). This latter case may occur if, for example, a radio telephone with a fully charged battery supplies 5.5V when the Vout should be 5V.

FIG. 2 illustrates the operation in regulation mode. The PWM is then stopped as soon as Vbat>Vout desired, and the REG regulator output is connected directly to the TP0 transistor grid. We thus obtain an analogue voltage instead of a digital voltage, linearly regulated.

In order to avoid damaging the components of the circuit powered, in particular if there is a short circuit on the output, or to detect an error, then the Iout current supplied to the load must also be checked. For example, if the latter is a chip card with a maximum consumption of 60 mA, then the power supply must be cut off if the current exceeds a threshold, for example 100 mA. In fact, this means that there is a problem with the card, or that it is inserted incorrectly, or there is an attempted fraud (e.g. a metal plate is inserted). In this case, the system has to be stopped and the output voltage discharged to 0 V.

In order to accomplish this, in the prior art a current/voltage conversion was used as shown in FIG. 3. A small resistor Rext is placed in series with the TP0 (or TN0) transistor to avoid penalising the performances. An amplifier 31 is connected to the two terminals of this resistor Rext. and it delivers the overload signal when the current exceeds the determined threshold.

It is not possible to use a resistor installed onto the silicium, which can vary on a scale of 1 to 3 (thus a risk of error when measuring the current of around 100%). This resistor must therefore be installed outside of the circuit.

This technique has a number of drawbacks, in terms of the cost (small high accuracy resistors are expensive), installation, size, etc. Installing a resistor of less than 1 Ω is not easy. The detection of 100 mA implies that there is at least 100 mV present (100 mA×1 Ω=100 mV) and therefore dissipation of the power of 0.1×0.1=10 mW.

In other terms, this technique is not very accurate: measurement is only carried out during the t1 time (or the t0 time, if the Rext resistor is in series with the TN0 transistor). This measurement is instantaneous and not a mean measurement. In other words, it does not detect the variations in the cyclical relationship.

Finally, with the possibility of switching from the pump mode to the regulation mode, the Rext resistor can only be installed in series with the TP0 PMOS transistor. This means that an extra input/output is required on the circuit for this precise external resistor.

BRIEF SUMMARY OF THE INVENTION

The invention is especially intended to counter these disadvantages of the prior art.

More precisely, one purpose of the invention is to provide a DCDC voltage converter overload detector that is more accurate than the known detectors.

Another purpose of the invention is to provide such an overload detector that delivers a mean value in the pump mode, without taking into account the cyclical relationship.

Another purpose of the invention is to provide such an overload detector that does not require the use of an external resistor, or any other external component, and that consequently does not require an extra output.

In other words, a purpose of the invention is to provide such an overload detector that is inexpensive to install, compact and more accurate and efficient.

These purposes, as well as others which will become clear, are achieved by means of a DCDC converter overload detector, the said converter supplies a load current with an output voltage (Vout) that may be different from a supply voltage (Vbat), by mans of a n inductance (L) and a first transistor (TP0), which is made conductive or blocked by a regulation device depending on the quantity of current demanded by the said load.

According to the invention, the overload detector has a means of capturing an image of the said load current at a predetermined smaller scale, and also a means of analysis that takes into account the said load current image to provide overload information when the said quantity of current is higher than a predetermined current threshold.

In this way, we dispose simply and efficiently of an accurate image of the overload current, without any external devices (such as a resistor) and with low power dissipation.

Advantageously, the said analysis means include a comparator which compares the said output voltage (Vout) with the voltage of the said load current image, the said comparator sending a reset command when the said voltage of the load current image is greater than the output voltage.

According to one preferred embodiment of the invention, the said means of capturing the load current image include a second transistor (TP1) installed in a mirror current of the first transistor (TP0), the width of the said second transistor being smaller than that of the first transistor in a proportion corresponding to the said scale.

According to one particular embodiment, the said scale is $\frac{1}{1000}$.

Advantageously, the said means of capturing the load current are connected to a controlled current source which produces a reference current that is proportional-to the predetermined current threshold, at the said predetermined scale.

Such an installation is particularly simple, with regard to the prior techniques.

Therefore, in preference:
the drains of the said first and second transistors are connected to the said inductance;
the grids of the said first and second transistors are connected to the said regulation means.

Furthermore, advantageously, the said regulation means have a regulator given the said output voltage and control either a pulse width modulator (in pump mode), or directly the grids of the first (TP0) and second (TP1) transistors (in regulation mode).

The invention also concerns the electronic components and devices containing at least an overload detector as described above.

Advantageously, such a device supplies an output voltage (Vout) intended to power at least one peripheral device likely to operate with the said device, and in particular at least a micro-circuit board.

Such a device could be a radio telephone for example, or include a radio telephony device.

BRIEF DESCRIPTION OF THE DRAWINGS

Other characteristics and advantages of the invention will become more clear after reading the following description according to a preferred embodiment of the invention, given simply as a means of example and not restrictive, and the appended diagrams in which.

FIGS. 1 and 2, already mentioned in the preamble, show the operating principles, known themselves, and an inductive DCDC converter, respectively in pump and regulation mode;

FIG. 3, also discussed in the preamble, shows an overload detector based on an external resistor, according to the prior art, fir the converter shown in FIGS. 1 and 2;

DETAILED DESCRIPTION

As already mentioned, the invention therefore provides an overload detector, which permits the output current of the converter to be detected accurately, without any external components and with a very small loss in efficiency.

Figure 4:
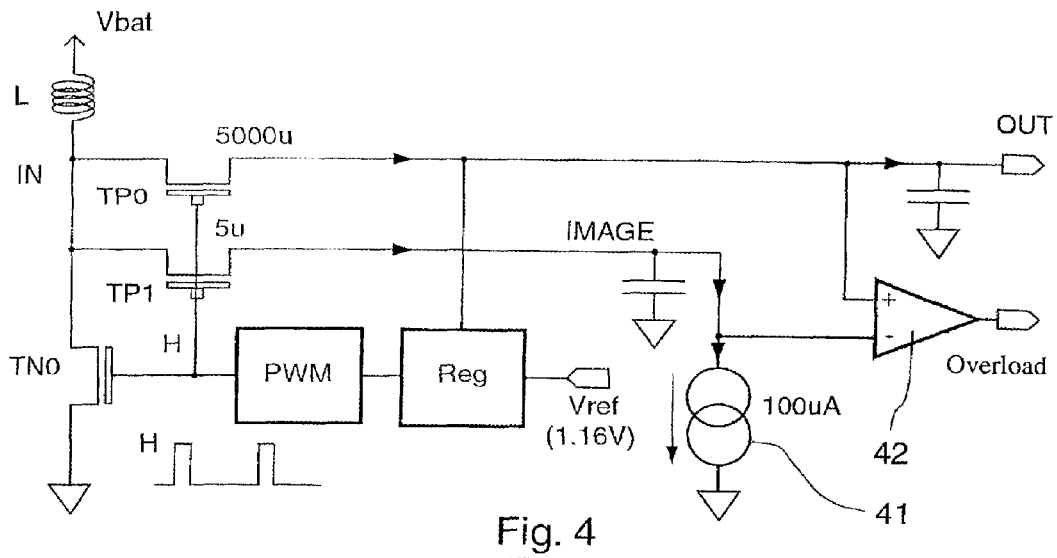
FIG. 4 shows an embodiment of an internal overload detector according to the invention.

FIG. 4 illustrates a preferred embodiment. It can be seen, using the same approach, certain elements which have already been commented upon, and which correspond to the principle of FIG. 1. On the other hand, it can be noted that the resistor of FIG. 2 has disappeared.

According to the invention, a transistor TP1 is installed in mirror current with regard to the TP0 transistor. Thus, the grid of the TP0 transistor is connected to that of the TP0 transistor, and the drain of the TP1 transistor is connected to the drain of the TP0 transistor.

The TP1 transistor is much smaller in size than the TP0 transistor. Hereafter, it is considered by way of example that it is 1000 times smaller, TP0 has a width of 5000 μ and TP1 a width of 5 μ. Consequently, the TP1 transistor is an image of the TP0 transistor, at a scale of $\frac{1}{1000}$.

A controlled current source 41, an example of which is rapidly described below by way of illustration, is connected to the TP1 transistor source (called IMAGE) The current pumped by this current source 41 is in this example, 100 μA.

A comparator 42 compares the OUT (TP0 source) and IMAGE (TP1 source) voltages. When the IMAGE voltage is greater than the OUT voltage, this means that the TP1 transistor is supplying more current than the current source 41 can develop, i.e. more than 100 μA. As TP1 is a mirror image of TP0 at a scale of $\frac{1}{1000}$, it can be deducted that the TP0 transistor supplies more than 100 mA (1000×100 μA).

This means that the regulation system is pumping excessively, to attempt to maintain the desired OUT value. This is therefore an overload situation, as the load consumes more than 100 mA.

The comparator 42 provides the OVERLOAD information, which orders the power supply, cut off.

Figure 5:
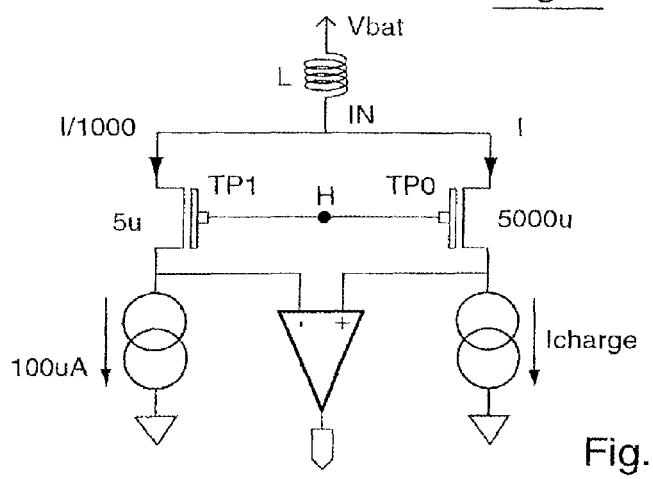
FIG. 5 is an equivalent diagram of the device of FIG. 4.

FIG. 5 is an (partially) equivalent diagram to that of FIG. 4, which permits the principle of the invention to be understood more clearly. The inductance L is connected via the IN terminal to the two transistors TP0 and TP1, installed in mirror image current. The TP1 transistor supplies current to a stable current source 41, whereas the TP0 transistor supplies the load (Icharge).

The comparator 42 receives the voltages supplied by each of the TP0 and TP1 transistors, and supplies the overload information (OVERLOAD=0V) as soon as Icharge is greater than 100 mA.

Figure 6:
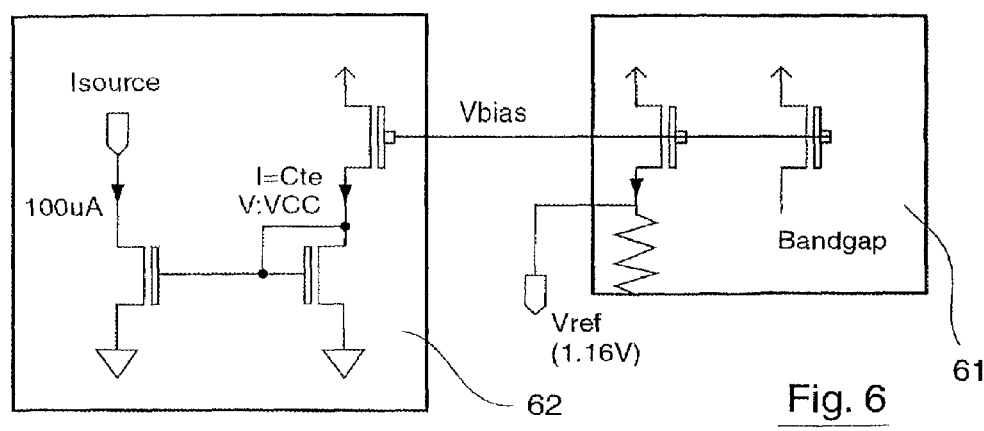
FIG. 6 shows an example of an embodiment of a stable current source, for the device of FIG. 4.

There are different types of stable current sources known. One embodiment is shown in FIG. 6. It is based on a bandgap module 61, which provides an accurate voltage reference Vref.

In order to supply this accurate voltage, the bandgap module 61 supplies a precise current to a resistor and a bipolar transistor. This current is constant regardless of the temperature, voltage and manufacturing process. It can therefore simply be copied (module 62) in order to obtain a precise I source current.

We will now present the operation of the invention regulator in more detail, from simulation.

Figure 7A:
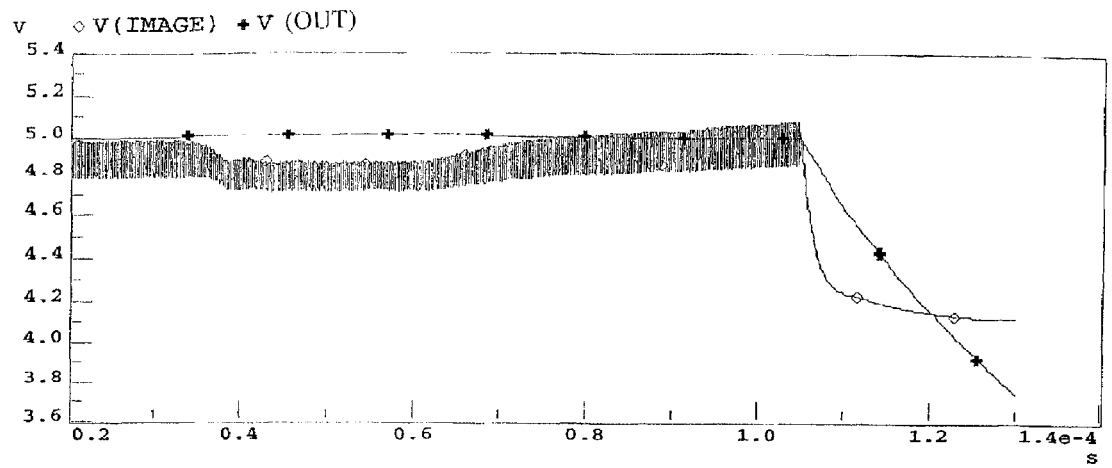
FIGS. 7A to 7C show a simulation of operation in pump mode of the device in FIG. 4.
Figure 7B:
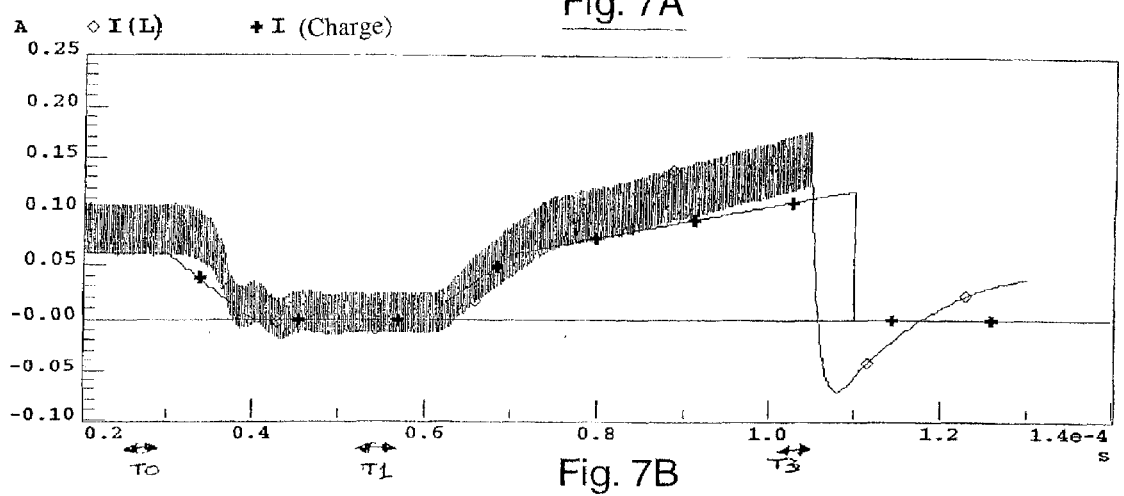
Figure 7C:
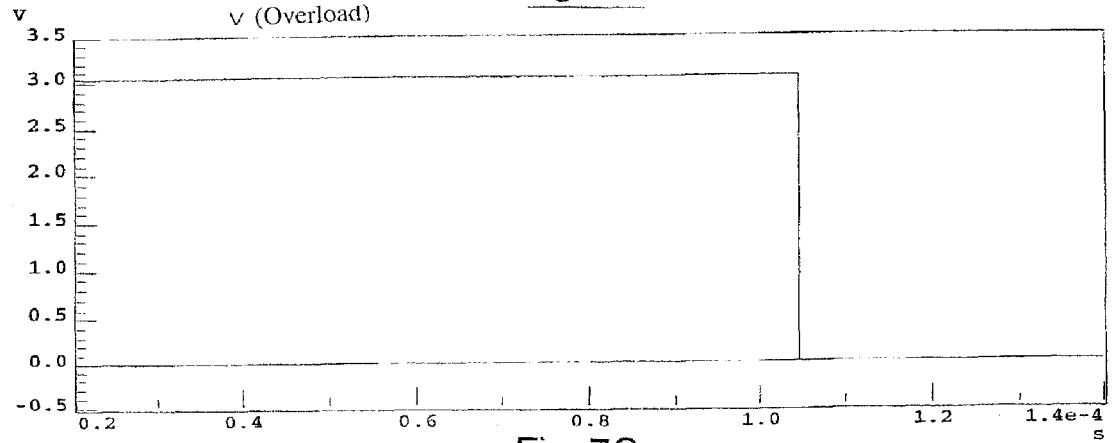

FIGS. 7A to 7C illustrate a pump mode operation, with respectively;
FIG. 7A: V(IMAGE) and V(OUT)
FIG. 7B: I(L) and I(Charge)
FIG. 7C: V(overload).

It can be noted that an output voltage V(out) regulated to 5V is indeed obtained, until V(image) exceeds (mean value) V(out). From this point, V(overload) passes to 0. This instant corresponds to that where the I(charge) current exceeds 100 mA.

Figure 8:
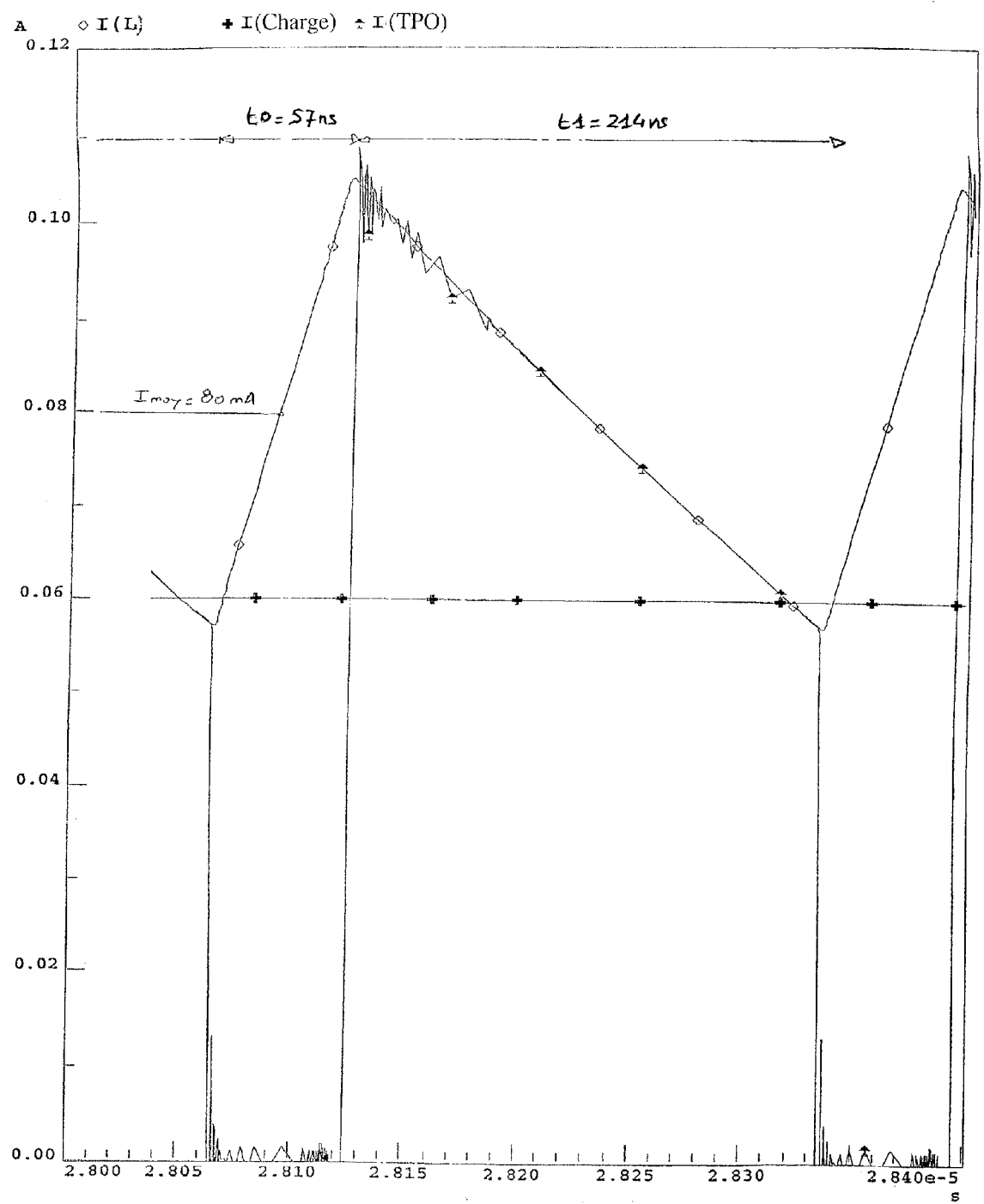
FIGS. 8 to 10 are enlarged portions of the simulation of FIGS. 7A to 7C.

FIG. 8 is an enlarged portion of the simulation of FIGS. 7A to 7C, corresponding to the period T0. It illustrates the operation of the regulator if Icharge=60 mA. At this time, t0=57 ns and t1=214 ns, and p=t0/(t0+t1)=21%, for a mean current supplied by the inductance of 80 mA. The current in the transistor TP0 is also represented, which functions according to the principle mentioned in the preamble.

Figure 9:
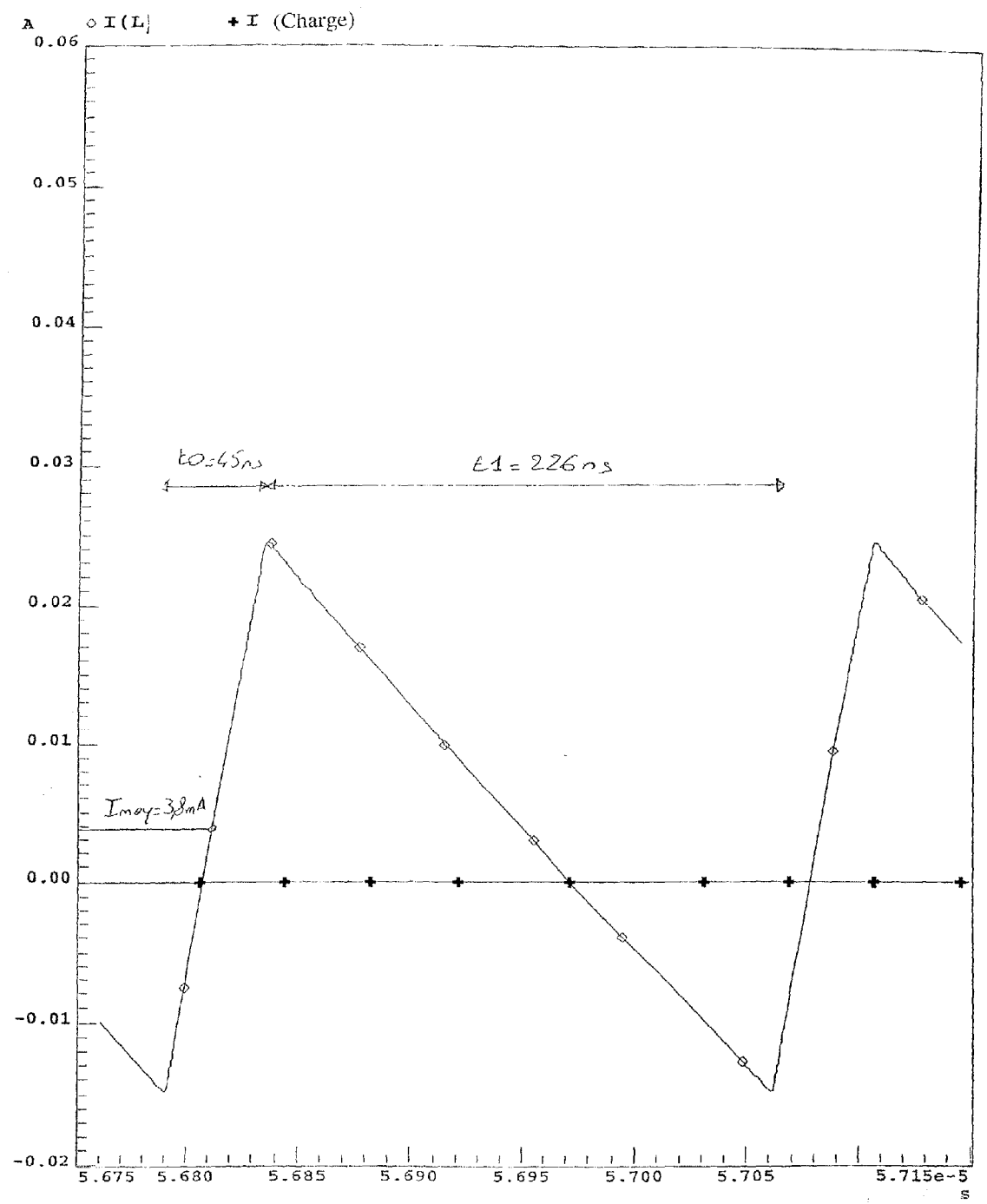

FIG. 9 is another enlarged portion, corresponding to the period T1, in which the load current is temporarily nil. The cyclical relationship is then modified: p=16.6%, where t0=45 ns and t1=226 ns.

Figure 10:
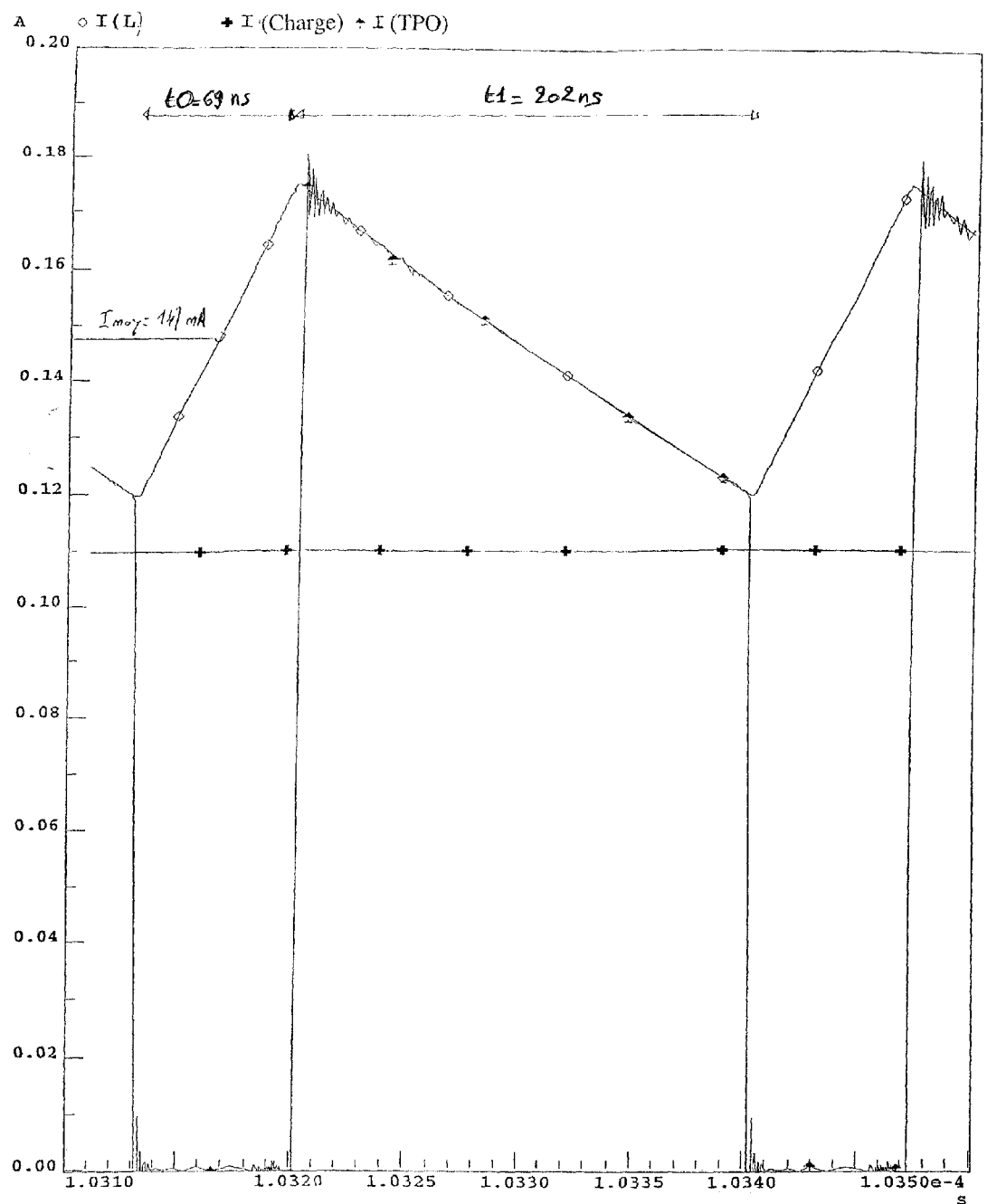

FIG. 10 is yet another enlarged portion, corresponding to the period T2, in which the load current increases to 110 mA. The cyclical relationship is then: $\rho$=25.5%, where t0=69 ns and t1=202 ns, before the operation is stopped by V(overload).

Figure 11A:
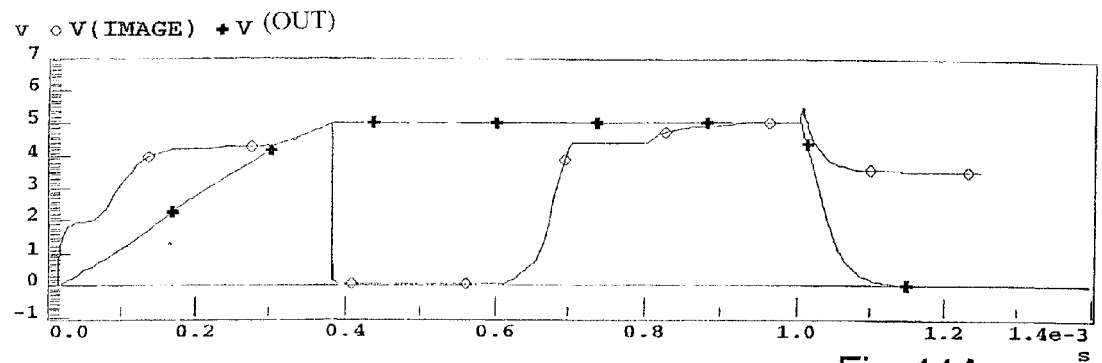
FIGS. 11A to 11D show a simulation of operation in regulation mode of the device of FIG. 4.
Figure 11B:
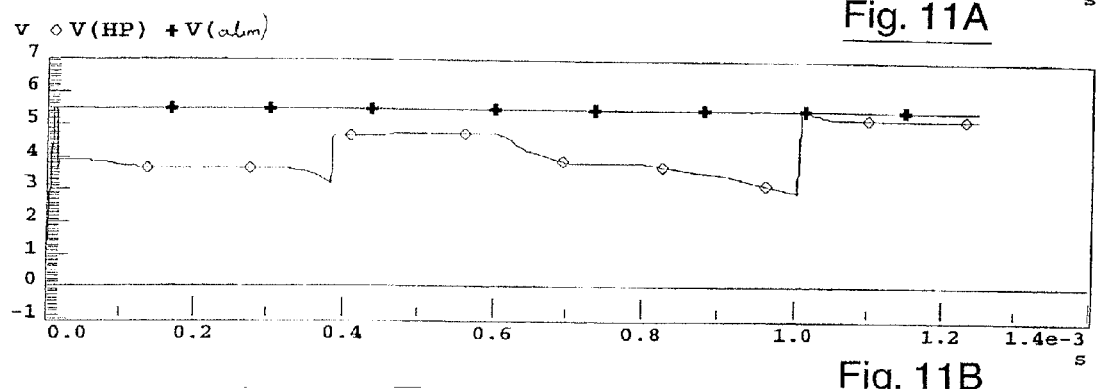
Figure 11C:
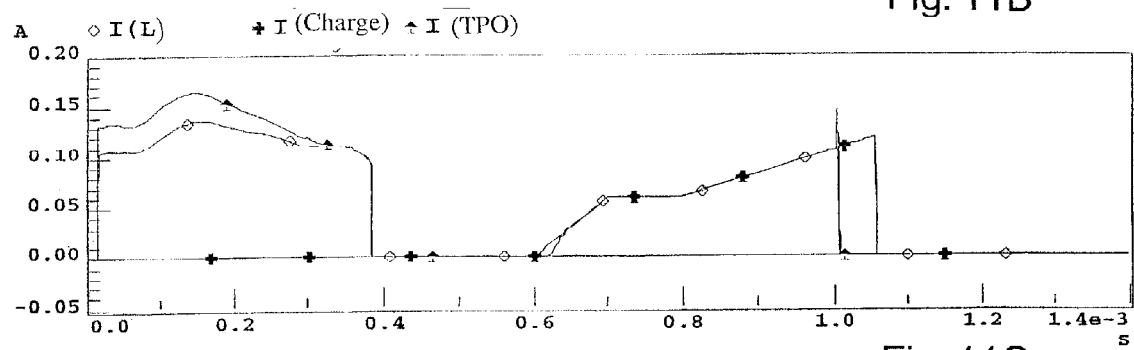
Figure 11D:
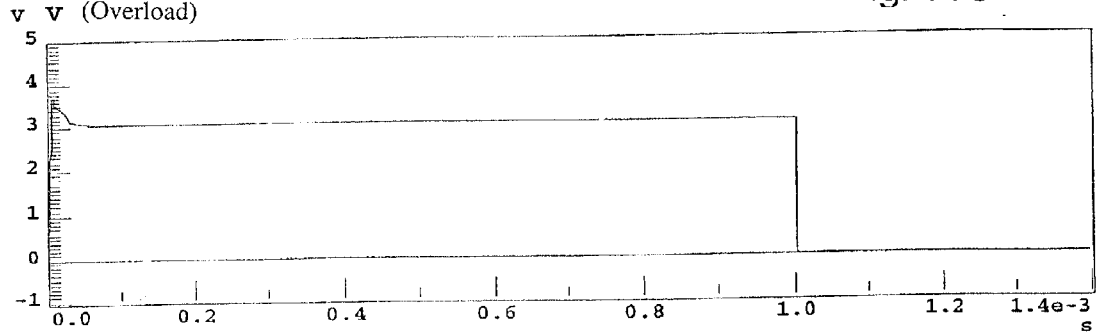

FIGS. 11A to 11D illustrate the operation of the invention in regulation mode, with:
FIG. 11A: V(image) and V(out);
FIG. 11B: V(HP) and V(supply)=5.5 V(>5V)
FIG. 11C: I(L), I(load) and I(TPO);
FIG. 11D: V(overload).

As previously, it can be seen that as soon as V(image) exceeds V(out), (FIG. 11A), V(overload) passes to 0V. In fact, I(charge) then exceeds 100 mA (FIG. 11C).

We then have, according to the invention, a reliable efficient system, which does not require any external components or extra outputs. This system is accurate, thanks to the use of the current source, and at most consumes 500 μW (100 μA×5V), whereas the prior technique consumed 10 mW for a control that was much less accurate.

Moreover, the value of the detected current is a mean value, and does not have to take into account the cyclical relationship in the pump mode.

The invention may find many applications in many fields, wherever a converter is required to increase or lower the voltage and control the current. In particular, it can be used for systems which use chip cards (reading of credit or SIM cards, in a radio telephone for example). Another example by way of illustration is the power supply to a microphone connected to a telephone.

The invention claimed is:

1. DCDC boost and regulation converter overload detector, the converter supplying a load current to a load at an output of the converter with an output voltage (Vout) that can be different from a supply voltage (Vbat), the converter comprising an inductance (L) and a first transistor (TP0) that is made conductive or blocked by a regulation device depending on the quantity of current demanded by the load, the load being distinct from the inductance,
   characterised in that it has means of capturing an image of the load current at a predetermined smaller scale and means of analysis, which takes the load current image into account to supply overload information when the quantity of current is higher than a predetermined current threshold;
   characterised in that the means of capturing the load current image are connected to a controlled current source that produces a reference current that is proportional to the predetermined current threshold, at the predetermined scale; and
   characterised in that the means of analysis includes a comparator that compares the output voltage (Vout) and the voltage of the load current image, the comparator supplying a reset command when the voltage of the load current image is greater than the output voltage.

2. Overload detector of claim 1, characterised in that the regulation means have a regulator which takes into account the output voltage and which controls either a pulse width modulator, in pump mode, or directly the gates of the first (TP0) and second (TP1) transistors (in regulation mode).

3. Overload detector of claim 1, characterised in that the scale is 1/1000.

4. Electrical component characterised in that it has at least one overload detector according to claim 1.

5. Device characterised in that it has at least one overload detector according to claim 1.

6. Device of claim 5, characterised in that the output supply voltage (Vout) is designed to power at least one peripheral device likely to operate with the device.

7. Device of claim 6, characterised in that at least one of the peripheral devices is a micro-circuit board.

8. Device of claim 5, characterised in that it has radio telephony means.

9. DCDC boost and regulation converter overload detector, the converter supplying a load current to a load at an output of the converter with an output voltage (Vout) that can be different from a supply voltage (Vbat), the converter comprising an inductance (L) and a first transistor (TP0) that is made conductive or blocked by a regulation device depending on the quantity of current demanded by the load, the load being distinct from the inductance,
   characterised in that it has means of capturing an image of the load current at a predetermined smaller scale and means of analysis, which takes the load current image into account to supply overload information when the quantity of current is higher than a predetermined current threshold;
   characterised in that the means of capturing the load current image has a second transistor (TP1) installed in mirror current with respect to the first transistor (TP0), the width of the second transistor being smaller than that of the first transistor in a proportion which corresponds to the scale;

characterised in that the means of capturing the load current image are connected to a controlled current source that produces a reference current that is proportional to the predetermined current threshold, at the predetermined scale; and characterised in that the means of analysis includes a comparator that compares the output voltage (Vout) and the voltage of the load current image, the comparator supplying a reset command when the voltage of the load current image is greater than the output voltage.

10. Overload detector of claim 9, characterised in that:

the drains of the first and second transistors are connected to the inductance; and the gates of the first and second transistors are connected to the regulation means.

* * * * *